(12) United States Patent
Zhang et al.

(10) Patent No.: US 11,387,342 B1
(45) Date of Patent: Jul. 12, 2022

(54) MULTI THRESHOLD VOLTAGE FOR NANOSHEET

(71) Applicant: INTERNATIONAL BUSINESS MACHINES CORPORATION, Armonk, NY (US)

(72) Inventors: Jingyun Zhang, Albany, NY (US); Takashi Ando, Eastchester, NY (US); Choonghyun Lee, Rensselaer, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/126,078

(22) Filed: Dec. 18, 2020

(51) Int. Cl.
| | |
|---|---|
| *H01L 29/423* | (2006.01) |
| *H01L 29/786* | (2006.01) |
| *H01L 27/088* | (2006.01) |
| *H01L 29/66* | (2006.01) |
| *H01L 29/06* | (2006.01) |
| *H01L 29/40* | (2006.01) |

(52) U.S. Cl.
CPC ...... *H01L 29/42392* (2013.01); *H01L 27/088* (2013.01); *H01L 29/0665* (2013.01); *H01L 29/401* (2013.01); *H01L 29/42364* (2013.01); *H01L 29/66742* (2013.01); *H01L 29/78696* (2013.01)

(58) Field of Classification Search
CPC ......... H01L 29/78696; H01L 29/42392; H01L 2029/7858; H01L 2029/785
See application file for complete search history.

(56) References Cited

U.S. PATENT DOCUMENTS

| | | | |
|---|---|---|---|
| 5,563,426 A * | 10/1996 | Zhang | H01L 29/66757 257/66 |
| 9,812,449 B2 | 11/2017 | Obradovic | |
| 10,026,652 B2 | 7/2018 | Wang | |
| 2019/0088798 A1 | 3/2019 | Kim | |
| 2019/0148237 A1 | 5/2019 | Wang | |

(Continued)

FOREIGN PATENT DOCUMENTS

| | | |
|---|---|---|
| CN | 108364910 A | 8/2018 |
| CN | 109904219 A | 6/2019 |

*Primary Examiner* — Changhyun Y
(74) *Attorney, Agent, or Firm* — L. Jeffrey Kelly

(57) ABSTRACT

A semiconductor structure including nanosheet stacks on a substrate, each nanosheet stack including alternating layers of sacrificial semiconductor material and semiconductor channel material and a crystallized gate dielectric layer surrounding the semiconductor channel layers of a first subset of the nanosheet stacks, a dipole layer on top of the crystallized gate dielectric and surrounding the layers of semiconductor channel material of the first subset of the nanosheet stacks and a gate dielectric modified by a diffused dipole material surrounding the semiconductor channel layers of a second subset of the nanosheet stacks. A method including forming nanosheet stacks on a substrate, each nanosheet stack including alternating layers of sacrificial semiconductor material and semiconductor channel material, removing sacrificial semiconductor material layers of the set of nanosheet stacks, forming a gate dielectric surrounding the semiconductor channel layers of the nanosheet stacks, and crystalizing the gate dielectric of a subset of the nanosheet stacks.

18 Claims, 14 Drawing Sheets

Structure A
Section A-A

Structure B
Section B-B

(56) References Cited

U.S. PATENT DOCUMENTS

2021/0183857 A1* 6/2021 Hafez .............. H01L 29/78696
2021/0184001 A1* 6/2021 Trivedi .............. H01L 27/0886
2021/0384299 A1* 12/2021 Ma ..................... H01L 29/516

* cited by examiner

US 11,387,342 B1

MULTI THRESHOLD VOLTAGE FOR NANOSHEET

BACKGROUND

The present invention relates, generally, to the field of semiconductor manufacturing, and more particularly to fabricating field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of stacked nanosheets extending between a pair of source drain epitaxial regions. The device may be a gate all around device or transistor in which the gate surrounds a portion of the nanosheet channel. A nanosheet device contains one or more layers of semiconductor channel material portions having a vertical thickness that is substantially less than its width.

Limited space between channels of a nanosheet device makes it difficult to adjust the threshold voltage using conventional techniques. It would be advantageous to have more than one threshold voltage in a semiconductor structure for increased design flexibility of semiconductor devices in the semiconductor structure.

SUMMARY

According to an embodiment, a semiconductor structure is provided. The semiconductor structure including nanosheet stacks on a substrate, each nanosheet stack including alternating layers of a sacrificial semiconductor material and a semiconductor channel material vertically aligned and stacked one on top of another, and a crystallized gate dielectric layer surrounding the semiconductor channel layers of a first subset of the nanosheet stacks, a dipole layer on top of the crystallized gate dielectric and surrounding the layers of semiconductor channel material of the first subset of the nanosheet stacks and a gate dielectric modified by a diffused dipole material surrounding the semiconductor channel layers of a second subset of the nanosheet stacks.

According to an embodiment, a semiconductor structure is provided. The semiconductor structure including nanosheet stacks on a substrate, each nanosheet stack including alternating layers of a sacrificial semiconductor material and a semiconductor channel material vertically aligned and stacked one on top of another, and a crystallized gate dielectric surrounding the semiconductor channel layers of the nanosheet stacks.

According to an embodiment, a method is provided. The method including forming nanosheet stacks on a substrate, each nanosheet stack including alternating layers of a sacrificial semiconductor material and a semiconductor channel material vertically aligned and stacked one on top of another, removing the sacrificial semiconductor material layers of the set of nanosheet stacks, forming a gate dielectric surrounding the semiconductor channel layers of the nanosheet stacks, and crystalizing the gate dielectric of a subset of the nanosheet stacks.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
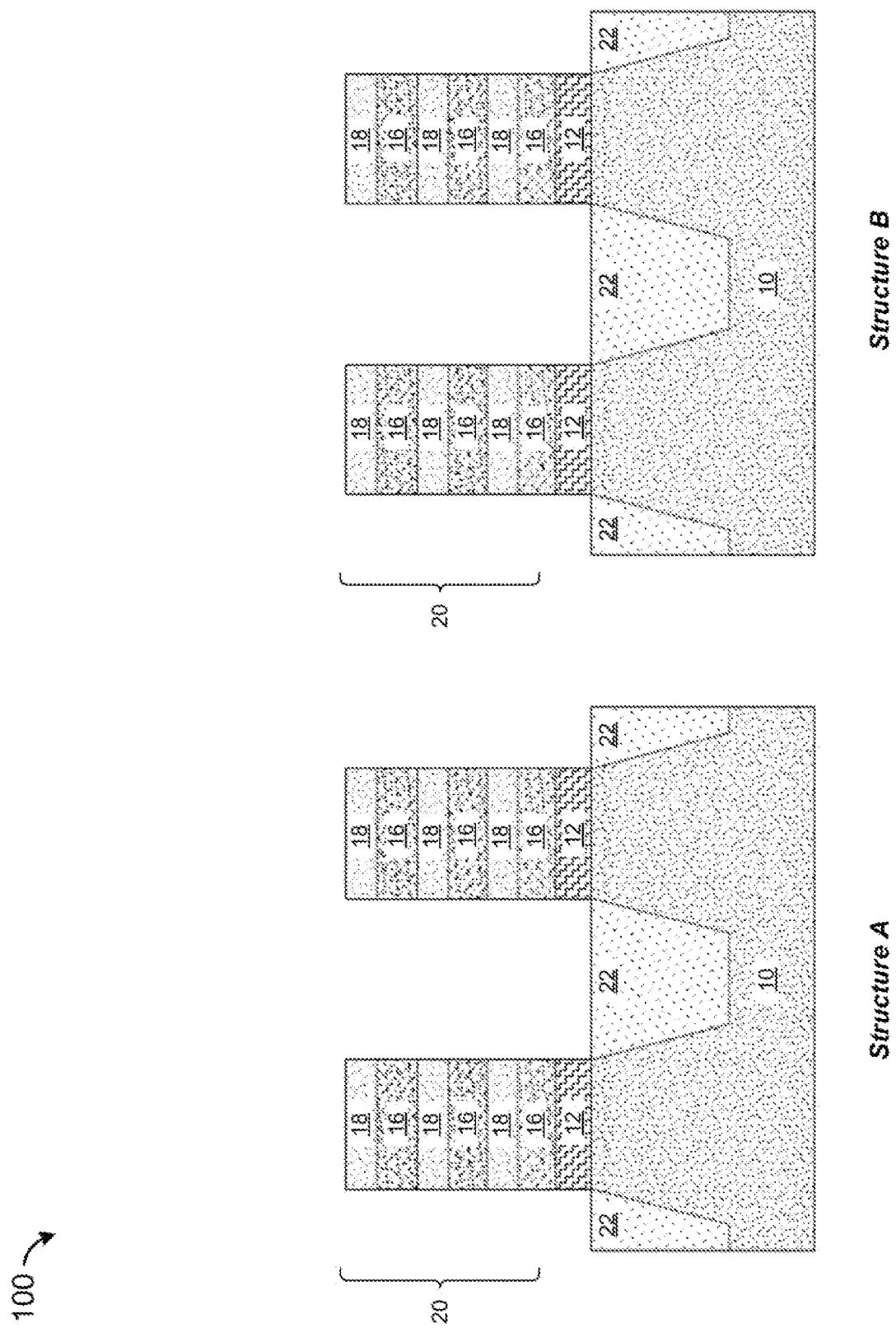
FIG. 1 illustrates a cross-sectional view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet transistor may be formed from stacked nanosheets, with alternate layers of silicon and silicon germanium, which are then formed into nanosheet stacks. A gate all around structure may be formed from a nanosheet stack. As dimensions of the nanosheet transistor continue to be reduced, close spacing between channels of a nanosheet transistor make it difficult to vary or adjust different threshold voltages.

The present invention generally relates to semiconductor manufacturing and more particularly to adjusting the threshold voltage of a nanosheet transistor. Adjusting the threshold voltage can be very challenging in nanosheet manufacturing due to aggressive device scaling.

The inventors discovered the threshold voltage of a nanosheet transistor can be adjusted by selectively crystallizing the gate dielectric layer. Additionally, the inventors discovered a dipole layer used to further adjust the threshold voltage does not diffuse into a crystallized gate dielectric. As such, the inventors discovered that selectively crystallizing the gate dielectric can be used to produce various different threshold voltages.

In particular, embodiments of the present invention disclose selectively crystalizing the gate dielectric layer during fabrication of nanosheet transistor to modify the transistor's threshold voltage. Additional embodiments of the present invention disclose selectively crystallizing the gate dielectric to prevent a dipole layer from diffusing into the gate dielectric and further produce multiple different threshold voltages. Techniques involving selectively crystallizing the gate dielectric are described in detail below by referring to the accompanying drawings in FIGS. 1-14, in accordance with an illustrative embodiment.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 of FIG. 1 may be formed or provided. Structure A and Structure B are the same at this point of fabrication and remain identical unless otherwise noted.

The structure 100 may include a nanosheet stack 20 separated by a bottom isolation layer 12 on a base substrate 10. The structure 100 may include a shallow trench isolation region (hereinafter "STI region") 22. It should be noted that, while a limited number of nanosheet stack 20 are depicted, any number of nanosheet stacks 20 may be formed.

The substrate 10 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 10 may be approximately, but is not limited to, several hundred microns thick. In other embodiments, the substrate 10 may be a layered semiconductor such as a silicon-on-insulator or SiGe-on-insulator, where a buried insulator layer, separates a base substrate from a top semiconductor layer.

A silicon germanium layer, not shown, may be formed on the substrate. The silicon germanium layer may, for example, have a germanium concentration about 60 atomic percent, although percentages greater than 60% and less than 60% may be used. The silicon germanium layer can be formed using a deposition technique or an epitaxial growth technique. The silicon germanium layer will subsequently be removed selective to the remaining layers of the nanosheet stack 20, as described below. As such, the silicon germanium layer can be made from other materials which allow for their selective removal.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

The nanosheet stack 20 includes vertically aligned alternating layers of sacrificial semiconductor material layer 16 and semiconductor channel material layer 18. The nanosheet stack 20 is formed on the silicon germanium layer. In FIG. 1, and only by way of an example, the nanosheet stack 20 includes three layers of sacrificial semiconductor material layer 16 and three layers of semiconductor channel material layer 18. The material stacks that can be employed in embodiments of the present invention are not limited to the specific embodiment illustrated in FIG. 1. The nanosheet stack 20 can include any number of sacrificial semiconductor material layers 16 and semiconductor channel material layers 18. The nanosheet stack 20 is used to produce a gate-all-around device that includes vertically stacked semiconductor channel material nanosheets for a p-channel field-effect transistor (PFET) or an n-channel field-effect transistor (NFET) device.

Each sacrificial semiconductor material layer 16 is composed of a first semiconductor material which differs in composition from at least an upper portion of the substrate 10 and differs in composition from the silicon germanium layer with 60% germanium. In an embodiment, each sacrificial semiconductor material layer 16 may have a germanium concentration less than 50 atomic percent. In another example, each sacrificial semiconductor material layer 16 may have a germanium concentration ranging from about 20 atomic percent to about 40 atomic percent. Each sacrificial semiconductor material layer 16 can be formed using known deposition techniques or an epitaxial growth technique as described above.

Each semiconductor channel material layer 18 is composed of a second semiconductor material which differs in composition from at least an upper portion of the substrate 10, differs in composition from the silicon germanium layer and differs in composition from the sacrificial material layer 16. Each semiconductor channel material layer 18 has a different etch rate than the first semiconductor material of sacrificial semiconductor material layers 16 and has a different etch rate than the silicon germanium layer. The second semiconductor material can be, for example, silicon. The second semiconductor material, for each semiconductor channel material layer 18, can be formed using known deposition techniques or an epitaxial growth technique as described above.

The nanosheet stack 20 (16, 18) can be formed by sequential epitaxial growth of alternating layers of the first semiconductor material and the second semiconductor material.

The sacrificial semiconductor material layers 16 of the nanosheet stack 20 may have a thickness ranging from about 5 nm to about 12 nm, while the semiconductor channel material layers 18 of the semiconductor stack 20 may have a thickness ranging from about 3 nm to about 12 nm. Each sacrificial semiconductor material layer 16 may have a thickness that is the same as, or different from, a thickness of each semiconductor channel material layer 18. In an embodiment, each sacrificial semiconductor material layer 16 has an identical thickness. In an embodiment, each semiconductor channel material layer 18 has an identical thickness.

The nanosheet stack 20 is formed by patterning the sacrificial semiconductor material layers 16 and the semiconductor channel material layers 18. The silicon germanium layer may be patterned simultaneously with the nanosheet stack 20. More specifically, portions of the sacrificial semiconductor material layers 16, the semiconductor channel material layers 18, and the silicon germanium layer are etched using an anisotropic etching technique, such as, for example, reactive ion etching (ME), and stopping on the substrate 10 and the STI regions 22. The nanosheet stack 20 includes alternating nanosheets of remaining portions of each sacrificial semiconductor material layer 16 and each semiconductor channel material layer 18 all on top of a remaining portion of the silicon germanium layer. After etching, sidewalls of each sacrificial semiconductor material layer 16 are vertically aligned to sidewalls of each semiconductor channel material layer 18, and to sidewalls of the silicon germanium layer.

Adjacent nanosheet stacks 20 may be isolated from one another by regions of dielectric material such as, for example, the STI regions 22. The STI regions 22 may be formed using known patterning and deposition techniques.

As previously mentioned, the silicon germanium layer is then selectively removed using one or more known techniques. In doing so, the silicon germanium layer is removed selective to the semiconductor channel material layers 18, the semiconductor channel material layers 18 and the STI regions 22. For example, a wet etching technique can be used to selectively remove the silicon germanium layer. The wet etching technique may employ special chemical solutions including, for example, tetramethylammonium hydroxide (TMAH) solution, potassium hydroxide (KOH) solution, and ethylene diamine and pyrocatechol (EDP) solution. Alternatively, for example, a wet etching technique that relies on a mixture solution of HF-HNO3-H2SO4 may be used.

The bottom isolation layer 12 may be formed on the substrate 10 and below the nanosheet stacks 20 in a gap created by removal of the silicon germanium layer. The bottom isolation layer 12 may be formed by conformally depositing a dielectric material, followed by one or more etch or recessing steps.

The bottom isolation layer 12 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the bottom isolation layer 12. Using a self-planarizing dielectric material as the bottom isolation layer 12 may avoid the need to perform subsequent etching or recessing. SiLK™ is a trademark of Dow Chemical Company.

In some embodiments, as shown, the bottom isolation layer 12 may be selectively etched such that vertical sides of the bottom isolation layer 12 align with the nanosheet stack 20, and a top surface of the STI regions 22 is exposed. An anisotropic etching technique, such as, for example, reactive ion etching (RIE) may be used to etch the bottom isolation 12. After etching, sidewalls of each sacrificial semiconductor material layer 16 are vertically aligned to sidewalls of each semiconductor channel material layer 18, and to sidewalls of the bottom isolation layer 12. In other embodiments, not shown, the bottom isolation layer 12 may remain a continuous layer extending from one nanosheet stack 20 to the next and covering the STI regions 22.

Figure 2:
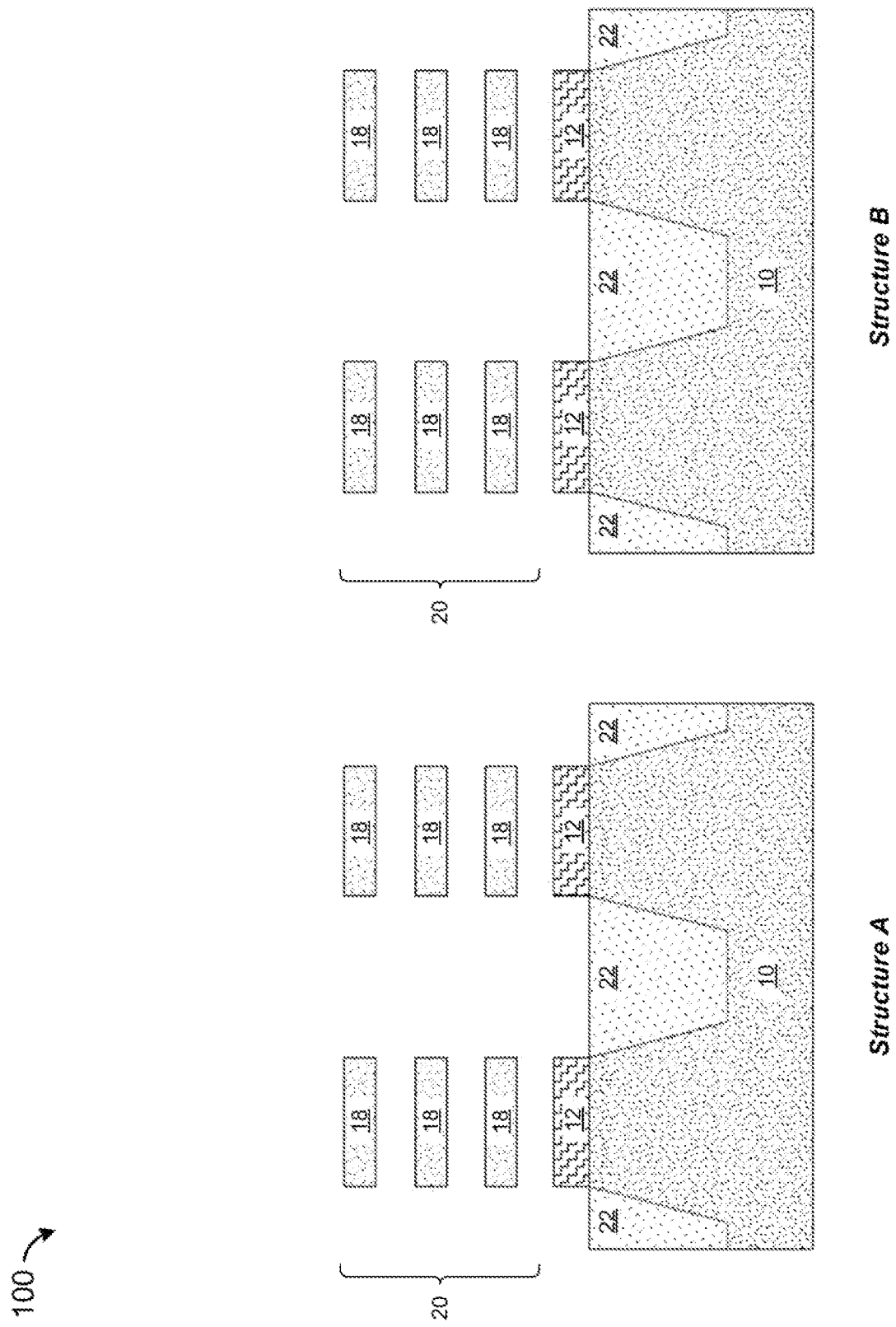
FIG. 2 illustrates a cross-sectional view of the semiconductor structure and illustrates selective removal of sacrificial semiconductor material layers, according to an exemplary embodiment.

Referring now to FIG. 2, the structure 100 is shown according to an exemplary embodiment. As shown in FIG. 2, the sacrificial semiconductor material layers 16 are selectively removed using one or more etching techniques. In doing so, the sacrificial semiconductor material layers 16 are removed selective to the semiconductor channel material layers 18, the bottom isolation layer 12 and the STI regions 22. As illustrated in FIG. 2, the remaining semiconductor channel material layers 18 are shown suspended and are supported on both ends by additional portions of the structure 100 which are not shown.

For example, a wet etching technique can be used to selectively remove the sacrificial semiconductor material layers 16. The wet etching technique may employ special chemical solutions including, for example, tetramethylammonium hydroxide (TMAH) solution, potassium hydroxide (KOH) solution, and ethylene diamine and pyrocatechol (EDP) solution. Alternatively, for example, a wet etching technique that relies on a mixture solution of HF-HNO3-H2SO4 may be used.

Figure 3:
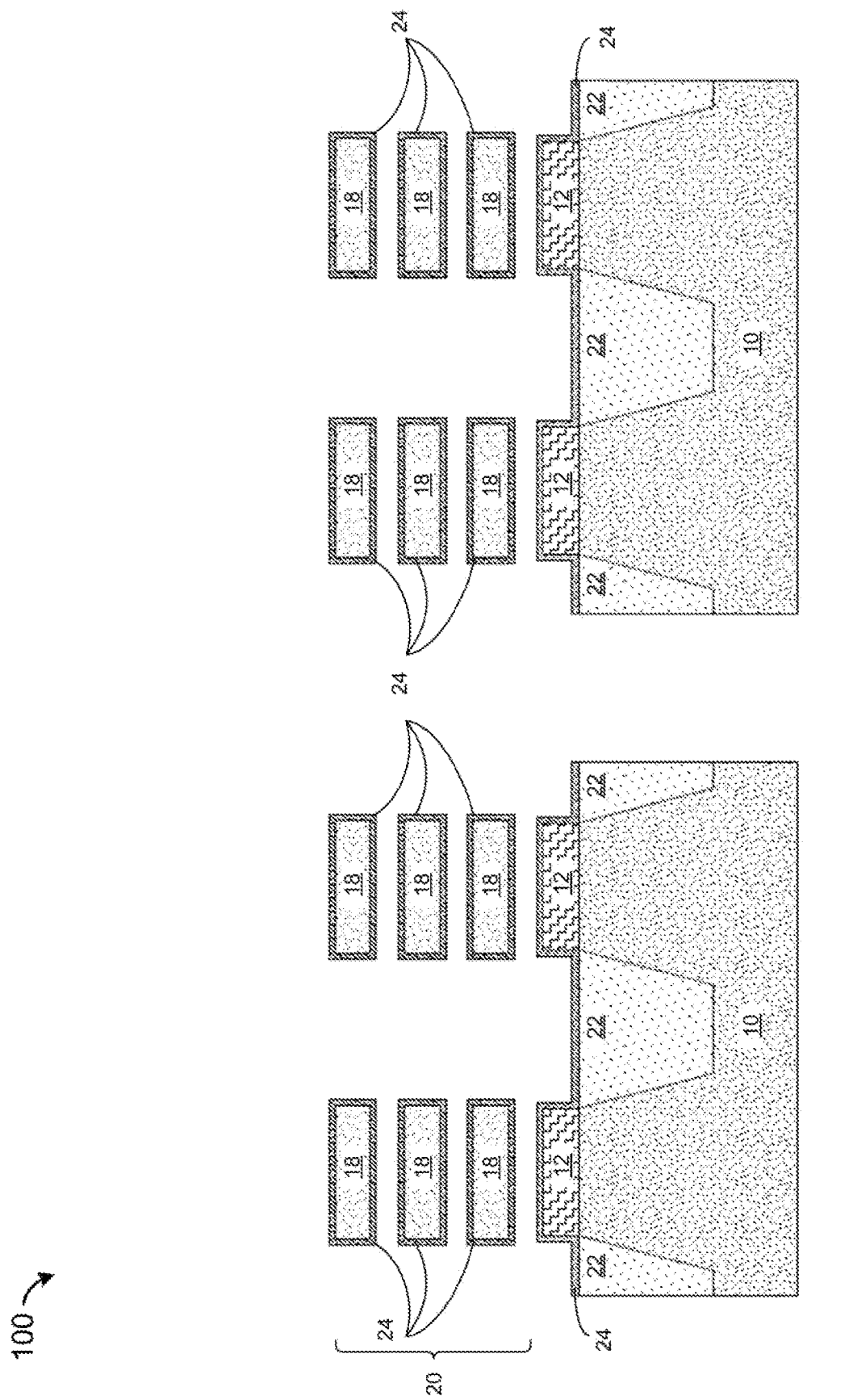
FIG. 3 illustrates a cross-sectional view of the semiconductor structure and illustrates formation of a gate dielectric, according to an exemplary embodiment.

Referring now to FIG. 3, the structure 100 is shown according to an exemplary embodiment. As shown in FIG. 3, a gate dielectric 24 is formed in each cavity and surrounding suspended portions of the semiconductor channel material layers 18. The gate dielectric 24 further covers the STI regions 22 and the bottom isolation layer 12 as illustrated. In practice, the gate oxide 24 is deposited directly on an interfacial layer (not shown). The interfacial layer will be a native oxide such as, for example, silicon oxide.

The gate dielectric 24 can be an oxide, nitride, and/or oxynitride. In an example, the gate dielectric 24 can be a high-k material. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials, e.g., silicon dioxide, and a high-k gate dielectric, can be formed and used as the gate dielectric 24.

The gate dielectric 24 can be formed by any deposition technique including, for example, atomic layer deposition (ALD), chemical vapor deposition (CVD), plasma enhanced chemical vapor deposition (PECVD), physical vapor deposition (PVD), sputtering, or other like deposition techniques. In an embodiment, the gate dielectric 24 can have a thickness ranging from approximately 1 nm to approximately 10 nm. Other thicknesses that are lesser than, or greater than, the aforementioned thickness range can also be employed for the gate dielectric 24.

Figure 4:
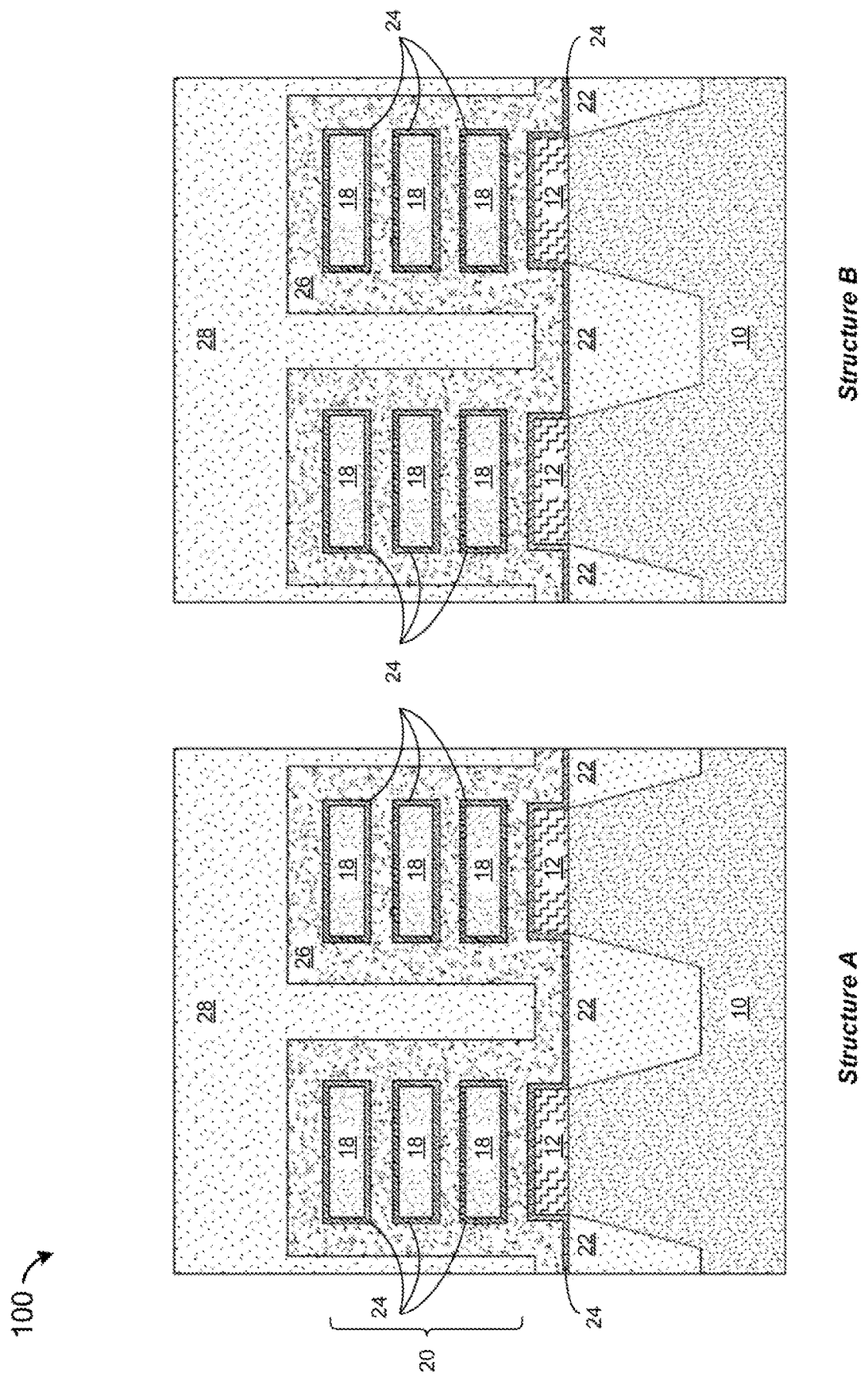
FIG. 4 illustrates a cross-sectional view of the semiconductor structure and illustrates formation of a first gate conductor and a first blanket sacrificial layer, according to an exemplary embodiment.

Referring now to FIG. 4, the structure 100 is shown according to an exemplary embodiment. As shown in FIG. 4, a first sacrificial gate 26 is formed on top of and covering the gate dielectric 24. For example, the first sacrificial gate 26 is formed in each cavity and surrounds suspended portions of the semiconductor channel material layers 18. Also as shown in FIG. 4, a first blanket sacrificial layer 28 may be formed, covering the first sacrificial gate 26, and may fill an area between adjacent nanosheet stacks 20.

The first sacrificial gate 26 can include any material, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof.

The first sacrificial gate 26 can be formed by any deposition technique including, for example, chemical vapor deposition (CVD), plasma enhanced chemical vapor deposition (PECVD), physical vapor deposition (PVD), sputtering, atomic layer deposition (ALD) or other like deposition techniques. When a metal silicide is formed, a conventional silicidation technique is used. In an embodiment, the first sacrificial gate 26 can have a thickness ranging from approximately 1 nm to approximately 50 nm, and more preferably ranging from approximately 3 nm to approximately 10 nm. Other thicknesses that are lesser than, or greater than, the aforementioned thickness range can also be employed for the first sacrificial gate 26. In an embodiment, the thickness of the first sacrificial gate 26 is deposited with a thickness sufficient to fill, or substantially fill, the spaces between adjacent semiconductor channel material layers 18, and completely surround each of the semiconductor channel material layers 18.

The first blanket sacrificial layer 28 can include any oxygen blocking material including, for example, amorphous silicon, polycrystalline silicon, amorphous carbon, amorphous germanium, polycrystalline germanium, or polycrystalline silicon-germanium made. The first blanket sacrificial layer 28 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition techniques.

Figure 5:
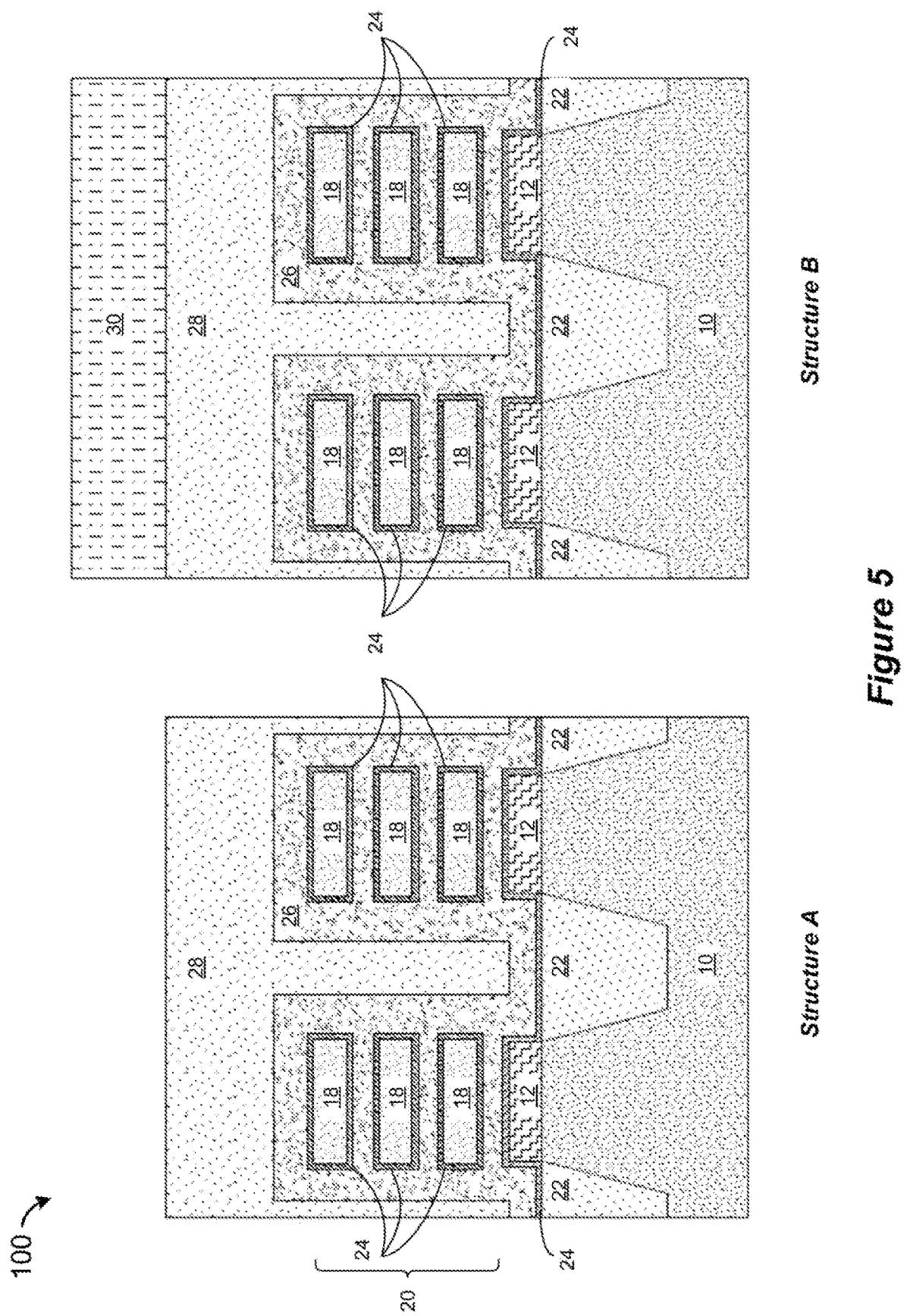
FIG. 5 illustrates a cross-sectional view of the semiconductor structure and illustrates forming an organic polymer layer, according to an exemplary embodiment.

Referring now to FIG. 5, the structure 100 is shown according to an exemplary embodiment. As shown in FIG. 5, an organic polymer layer 30 may be selectively formed. The organic polymer layer 30 may cover selected nanosheet stacks 20, and may not cover other nanosheet stacks 20. As shown in FIG. 5, the organic polymer layer 30 is used to cover the two nanosheet stacks 20 in Structure B, and not the two nanosheet stacks in Structure A.

The organic polymer layer 30 may be formed by a blanket deposition using typical deposition techniques, for example, atomic layer deposition (ALD), chemical vapor deposition (CVD), plasma enhanced chemical vapor deposition (PECVD), physical vapor deposition (PVD), sputtering, or other like deposition techniques. The material of the organic polymer layer 30 may include a photo-sensitive organic polymer including a light-sensitive material. The organic polymer may include epoxy resin, phenol resin, polyacrylate resin, polyamide resin, polyimide resin, unsaturated polyester resin, polyphenylenesulfide resin, polyphenylenether resin, or benzocyclobutene (BCB). The material of the organic polymer layer 30 may be selected to be compatible with the first sacrificial gate 26 and the first blanket sacrificial layer 28. Specifically, the materials are chosen such that one or more of the first sacrificial gate 26, the first blanket sacrificial layer 28, or the organic polymer layer 30 may be etched or recessed selective to one another.

At this point of fabrication, the Structures A and B are different. Specifically, the organic polymer layer 30 covers only the Structure B, and does not cover the Structure A.

Figure 6:
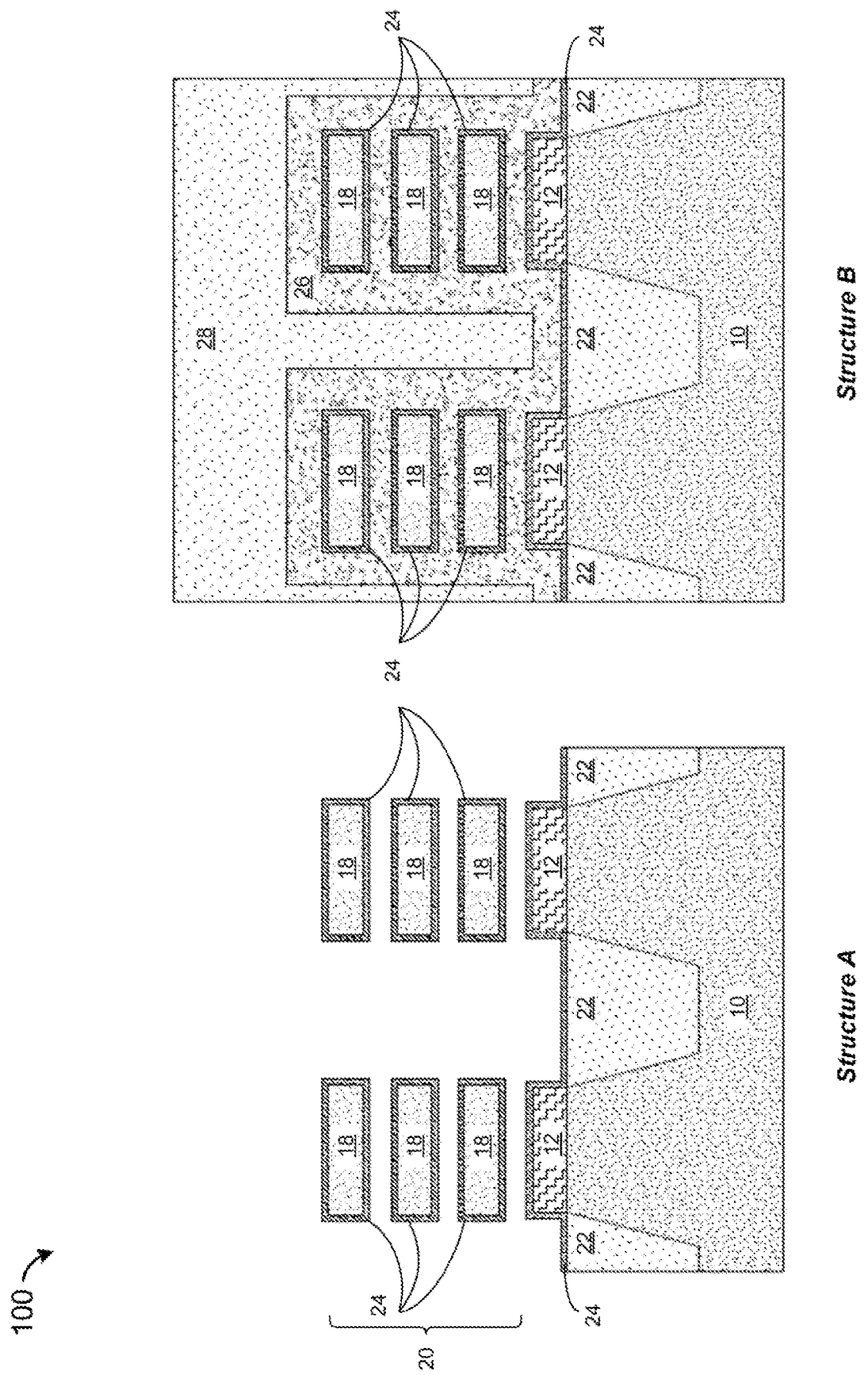
FIG. 6 illustrates a cross-sectional view of the semiconductor structure and illustrates selective removal of the first blanket sacrificial layer and the first gate conductor, according to an exemplary embodiment.

Referring now to FIG. 6, the structure 100 is shown according to an exemplary embodiment. As shown in FIG. 6, the first blanket sacrificial layer 28 and the first sacrificial gate 26 may be selectively removed from the Structure A. Subsequently, the organic polymer layer 30 may be removed from the Structure B.

As described above, a wet etching technique can be used to selectively remove the first blanket sacrificial layer 28 and the first gate 26 selective to the organic polymer layer 30. The wet etching technique may employ special chemical solutions including, for example, tetramethylammonium hydroxide (TMAH) solution, potassium hydroxide (KOH) solution, and ethylene diamine and pyrocatechol (EDP) solution. Alternatively, for example, a wet etching technique that relies on a mixture solution of HF-HNO3-H2SO4 may be used. The etching may be performed in one or more steps.

Following the removal of the first blanket sacrificial layer 28 and the first sacrificial gate 26 in the Structure A, the organic polymer layer 30 may be removed from the Structure B. A wet etching technique may be used to selectively remove the organic polymer layer 30, selective to the first blanket sacrificial layer 28 of the Structure B, the first sacrificial gate 26 and the gate dielectric 24.

At this point of fabrication, the Structures A and B are different. Specifically, the first blanket sacrificial layer 28 and the first sacrificial gate 26 remain in the Structure B, while neither the first blanket sacrificial layer 28 nor the first sacrificial gate 26 remain on the Structure A.

Figure 7:
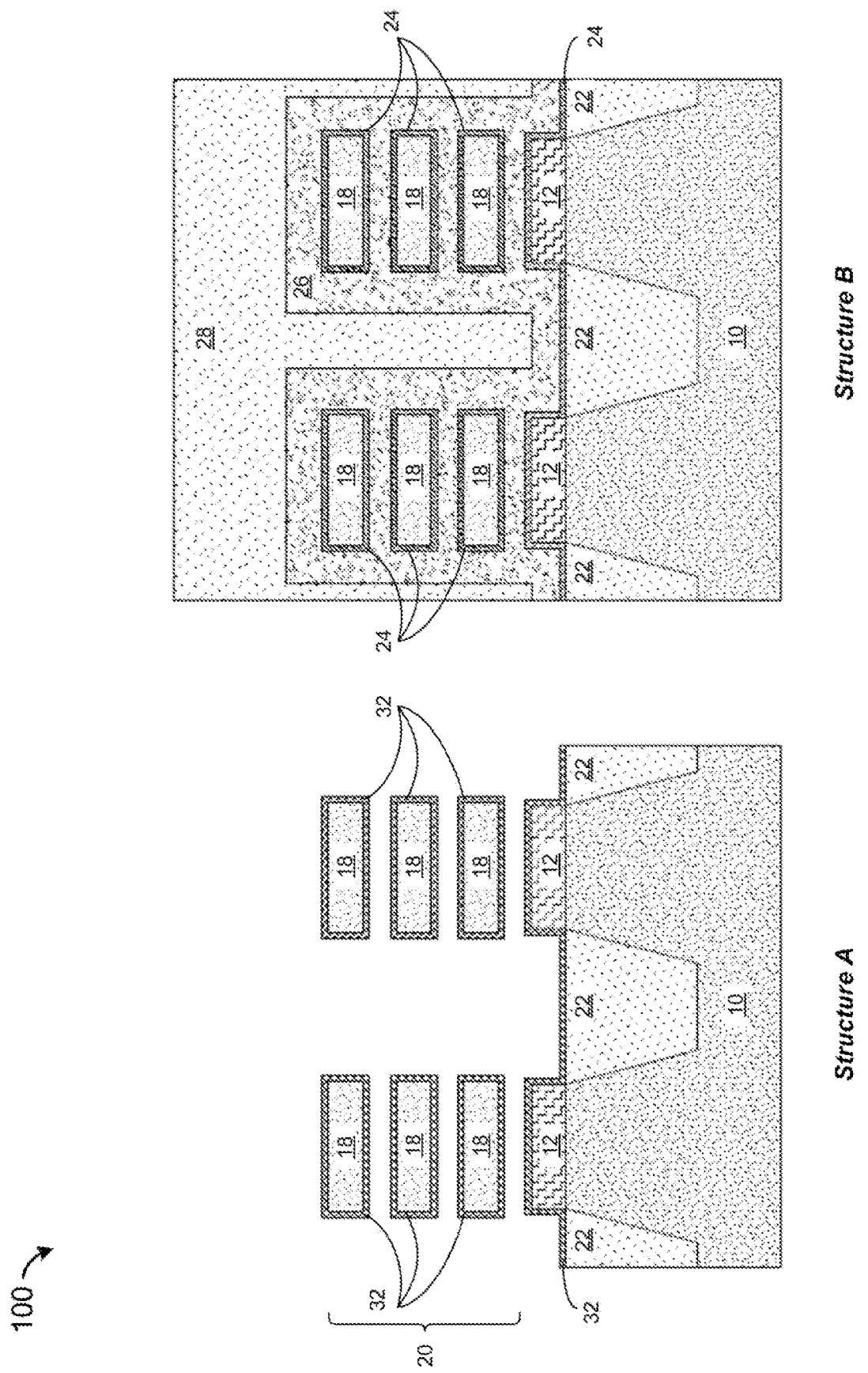
FIG. 7 illustrates a cross-sectional view of the semiconductor structure and illustrates selective crystallization of the gate dielectric, according to an exemplary embodiment.

Referring now to FIG. 7, the structure 100 is shown according to an exemplary embodiment. As shown in FIG. 7, the structure 100 may be exposed to a spike anneal, a high temperature anneal, a laser spike anneal, or another type of an anneal, to crystalize exposed portions of gate dielectric 24. In the structure A, the gate dielectric 24 becomes a crystallized gate dielectric 32 with different properties than the gate dielectric 24. Because the gate dielectric 24 in the Structure B is protected by the first sacrificial gate 26 and the first blanket sacrificial layer 28, and thus not exposed, it will not be crystallized by the spike anneal.

In an embodiment, the annealing technique may include subjecting the structure 100 to an elevated temperature, ranging from approximately 800° C. to approximately 1250° C., for approximately 1 ms to approximately 500 ms. In another embodiment, a high-temperature rapid thermal anneal (RTA) technique may be used. Typically, high temperatures cannot be used during fabrication due to risk of damaging a gate metal or work function metal; however, in the present case neither the gate metal nor the work function metal have been formed yet.

The threshold voltage of a nanosheet transistor is dependent upon the material and structure of the nanosheet stack 20, and also depends upon a thickness and composition of the gate dielectric surrounding each of the semiconductor channel material layers 18 of the nanosheet stack 20. Prior to the laser spike anneal, the Structure A and the Structure B each had the same gate dielectric layer (i.e. the gate dielectric 24) formed at the same time, with the same original thickness and composition, and thus would have the same or substantially the same threshold voltage. However, after the laser spike anneal step, the Structure A has the crystallized gate dielectric 32, which has a different composition, compared to the gate dielectric 24 of the Structure B. As such, the threshold voltage for the Structure A will be different from the threshold voltage for the Structure B.

The use of spike laser anneal allows for selective crystallization without additional processing steps. Traditionally, additional processing steps would be required to form the Structure A and the Structure B with different gate dielectrics and different threshold voltages.

Figure 8:
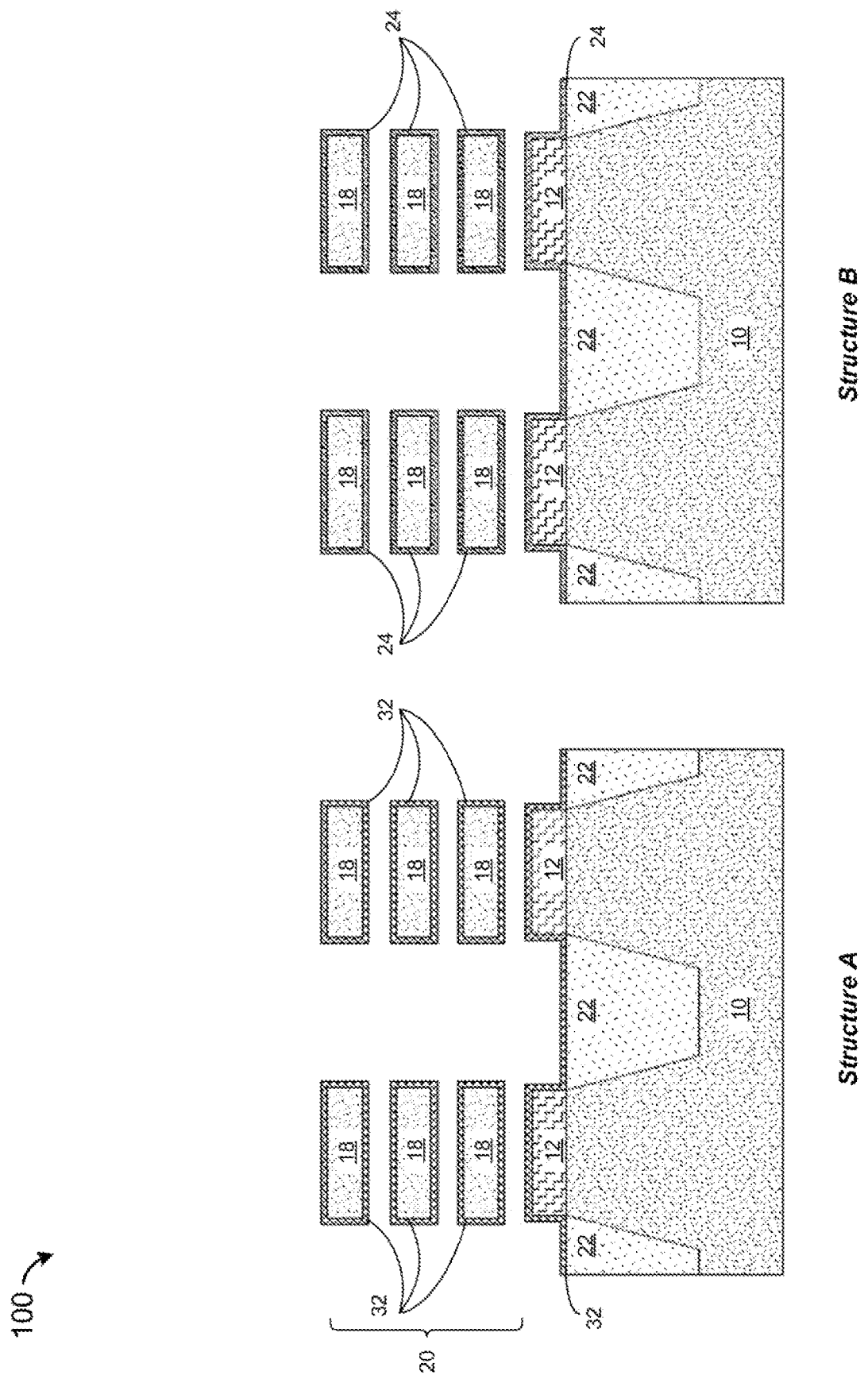
FIG. 8 illustrates a cross-sectional view of the semiconductor structure and illustrates removal of remaining first blanket sacrificial layer and remaining first gate conductor, according to an exemplary embodiment.

Referring now to FIG. 8, the structure 100 is shown according to an exemplary embodiment. As shown in FIG. 8, portions of the first blanket sacrificial layer 28 and the first sacrificial gate 26 remaining on the Structure B are removed.

As described above, a wet etching technique can be used to selectively remove remaining portions of the first blanket sacrificial layer 28 and the first sacrificial gate 26 selective to the gate dielectric 24 and the crystallized gate dielectric 32.

Figure 9:
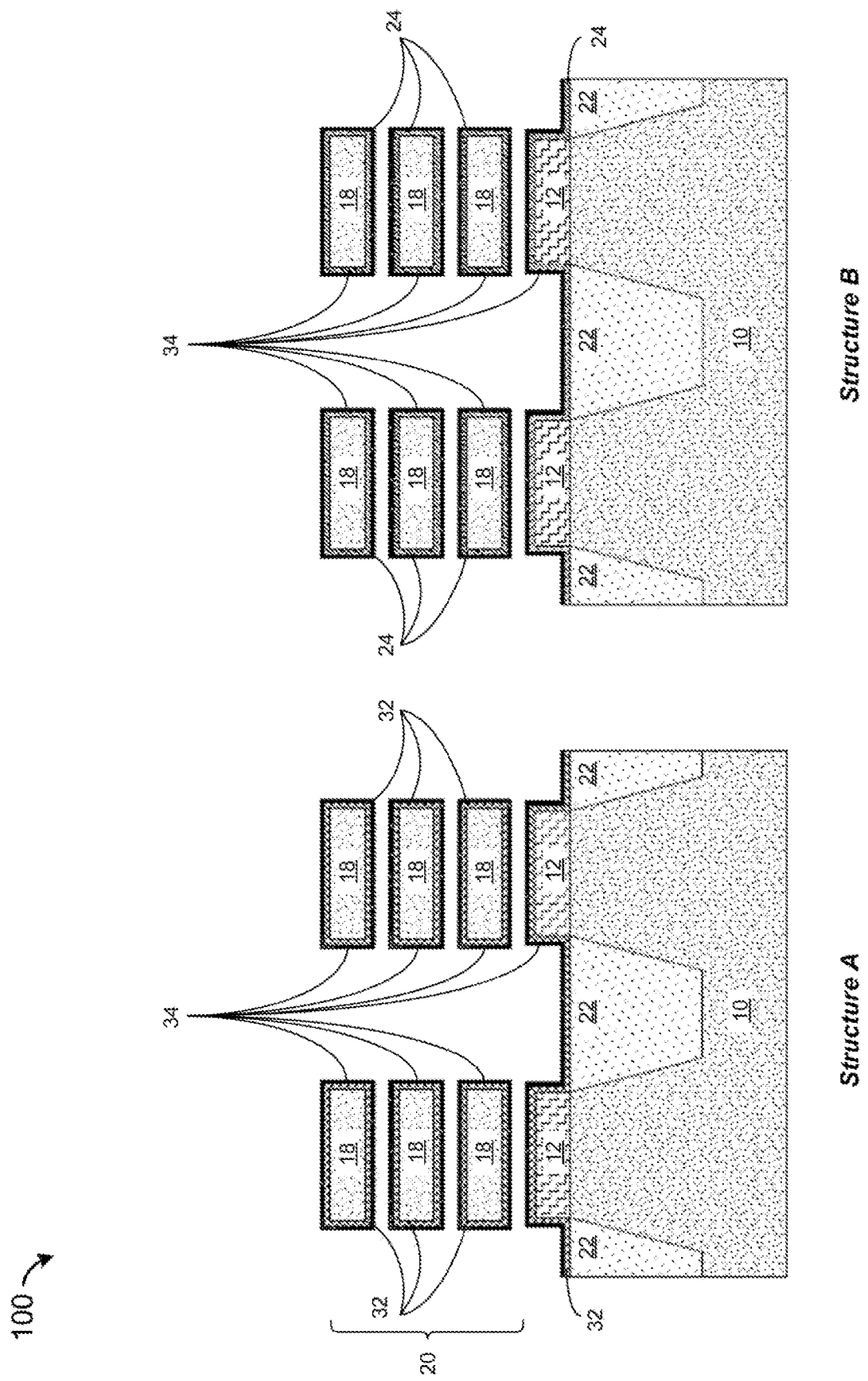
FIG. 9 illustrates a cross-sectional view of the semiconductor structure and illustrates formation of a dipole layer, according to an exemplary embodiment.

Referring now to FIG. 9, the structure 100 is shown according to an exemplary embodiment. As shown in FIG. 9, a dipole layer 34 may be formed.

In the Structure A, the dipole layer 34 is formed on top of the crystallized gate dielectric 32 surrounding the semiconductor channel material layers 18 of the nanosheet stack 20. The dipole layer 34 is further formed on top of the crystallized gate dielectric 32 covering the bottom isolation layer 12 and the STI regions 22.

In the Structure B, the dipole layer 34 is formed on top of the gate dielectric 24 surrounding the semiconductor channel material layers 18 of the nanosheet stack 20. The dipole layer 34 is further formed on top of the gate dielectric 24 covering the bottom isolation layer 12 and the STI regions 22.

The dipole layer 34 may by formed by a blanket deposition using typical deposition techniques, for example, atomic layer deposition (ALD), chemical vapor deposition (CVD), plasma enhanced chemical vapor deposition (PECVD), physical vapor deposition (PVD), sputtering, or other like deposition techniques. The material of the dipole layer 34 may include any suitable dipole layer know to a person having ordinary skill in the art. For example, in some embodiments the dipole layer 34 may include lanthanum oxide ($La_2O_3$) or aluminum oxide ($Al_2O_3$). In some embodiments, lanthanum oxide ($La_2O_3$) is commonly used for NFET devices and aluminum oxide ($Al_2O_3$) is commonly used for PFET devices. In other embodiments, some combination of lanthanum oxide ($La_2O_3$) and aluminum oxide ($Al_2O_3$) can be used for either NFET devices or PFET devices in order to achieve desired device characteristics.

Adjusting the material of the dipole layer 34 may be another method to alter or change the threshold voltage for the nanosheet transistors. In an embodiment, for example, a lanthanum oxide ($La_2O_3$) dipole layer (34) may typically lower the threshold voltage of an NFET device and may typically raise the threshold voltage of a PFET device. In an alternate embodiment, for example, a aluminum oxide ($Al_2O_3$) dipole layer (34) may typically increase the threshold voltage of an NFET device and may typically lower the threshold voltage of a PFET device.

In some embodiments, it may be desirable to selectively deposit the dipole layer 34 over select nanosheet stacks 20, and not others.

Figure 10:
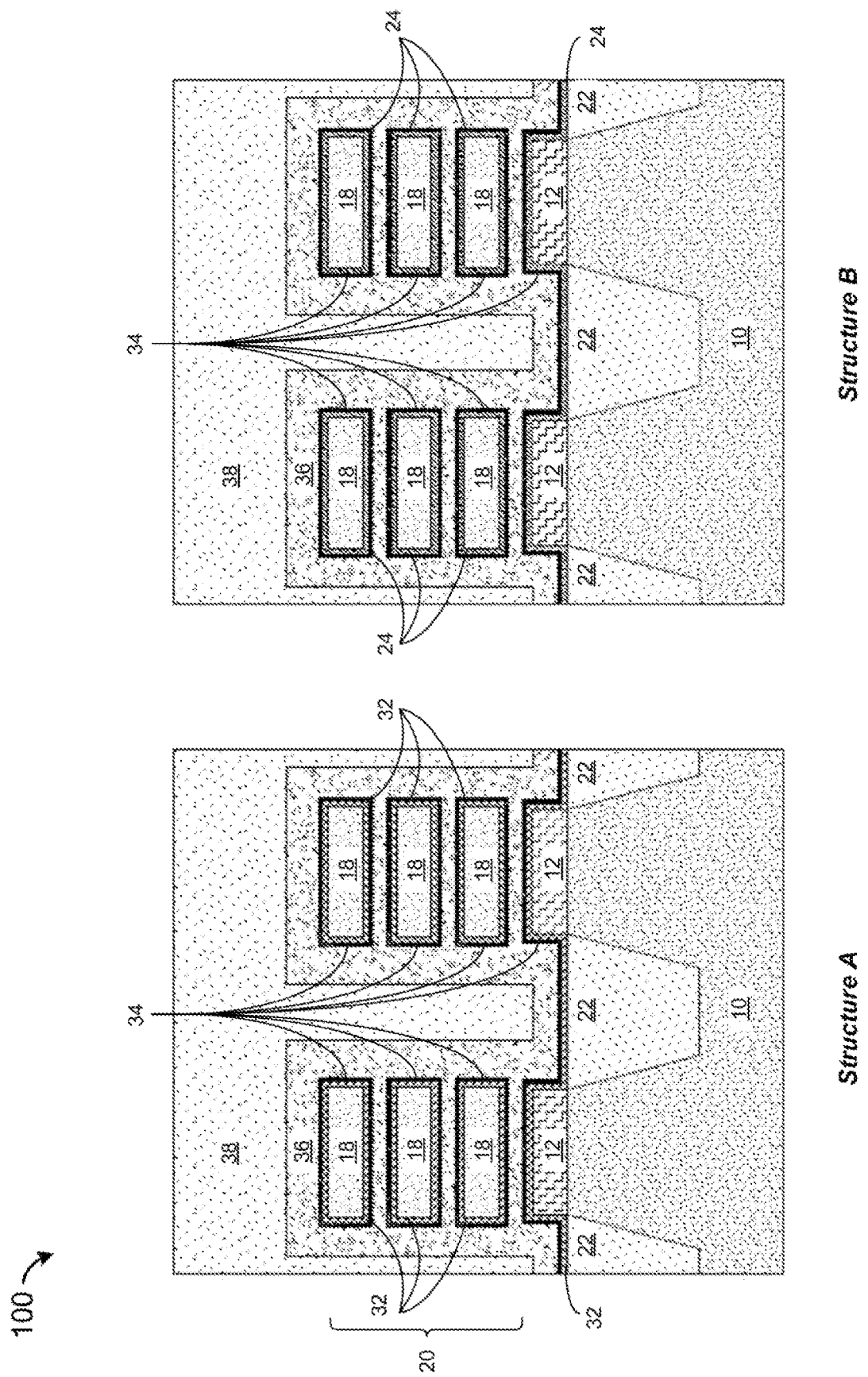
FIG. 10 illustrates a cross-sectional view of the semiconductor structure and illustrates formation of a second gate conductor and a second blanket sacrificial layer, according to an exemplary embodiment.

Referring now to FIG. 10, the structure 100 is shown according to an exemplary embodiment. As shown in FIG. 10, a second sacrificial gate 36 is formed.

In the Structure A, the second sacrificial gate 36 is formed in each cavity and surrounding suspended portions of the semiconductor channel material layers 18, the crystallized gate dielectric 32 and the dipole layer 34. Meanwhile, in the Structure B the second sacrificial gate 36 is formed in each cavity and surrounding suspended portions of the semiconductor channel material layers 18, the gate dielectric 24 and the dipole layer 34. In some cases, the second sacrificial gate 36 may also cover the STI regions 22 and surfaces of the bottom isolation layer 12.

Also as shown in FIG. 10, a second blanket sacrificial layer 38 may be formed, covering the second sacrificial gate conductor 36, and may fill an area between adjacent nanosheet stacks 20.

The second sacrificial gate conductor 36 may be formed and include materials as described above for the first sacrificial gate 26. The second blanket sacrificial layer 38 may be formed and include materials as described above for the first blanket sacrificial layer 28.

Figure 11:
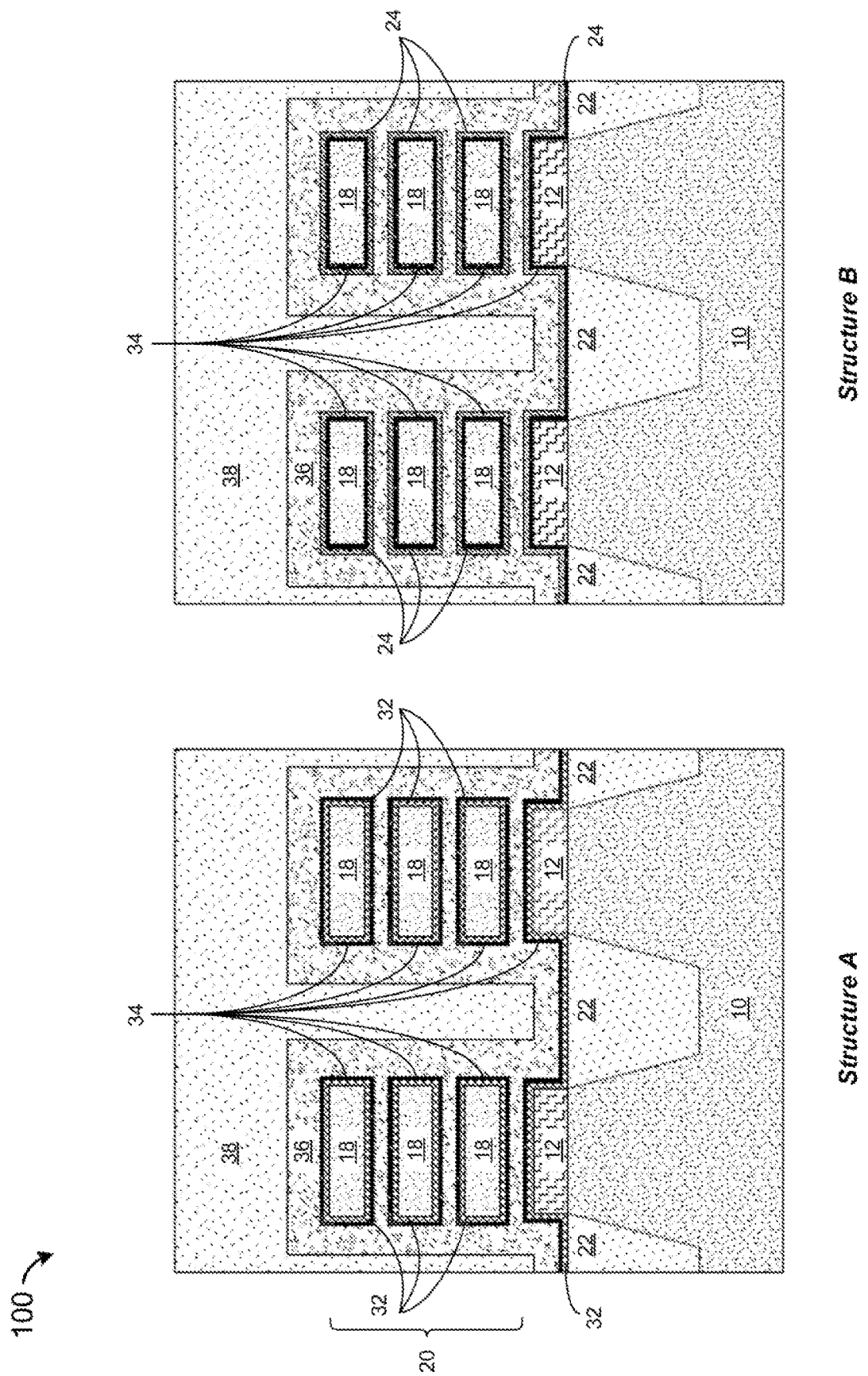
FIG. 11 illustrates a cross-sectional view of the semiconductor structure and illustrates an annealing step, according to an exemplary embodiment.

Referring now to FIG. 11, the structure 100 is shown according to an exemplary embodiment. As shown in FIG. 11, an annealing step is performed to cause the dipole layer 34 to diffuse into the gate dielectric 24 in Structure B only. In contrast, the dipole layer 34 does not diffuse into the crystallized gate dielectric 32 of the Structure A, but instead remains on top of the gate dielectric layer 24.

More specifically, the Structure A remains substantially the same before and after the anneal, because the crystalized gate dielectric 32 prevents diffusion of the dipole layer 34. As such, in the Structure A only, the crystallized gate dielectric 32 separates the dipole layer 34 from the semiconductor channel material layers 18. In contrast, annealing causes the dipole layer 34, to diffuse into the (amorphous) gate dielectric layer 24 of the Structure B. After annealing, the dipole material, for example lanthanum oxide ($La_2O_3$), aluminum oxide ($Al_2O_3$), or both, from the dipole layer 34 can be detected within the gate layer 24 and at the interface between the gate later 24 and the interfacial layer. Annealing may include a spike anneal, a high temperature anneal, or a laser spike anneal, or another type of an anneal, as described herein above.

Causing the dipole layer 34 to diffuse into the gate dielectric layer 24 of the Structure B, is another example of how selective crystallization, or lack thereof in the present example, can be used to adjust or change the threshold voltage of a nanosheet device in accordance with the disclosed embodiments. For example, the Structure B with the diffused dipole material can be designed and fabricated with a different threshold than the Structure A. Even more unique, the disclose embodiments teach how to fabricate nanosheet devices with different threshold voltages using selective crystallization of the gate dielectric layer 24.

Figure 12:
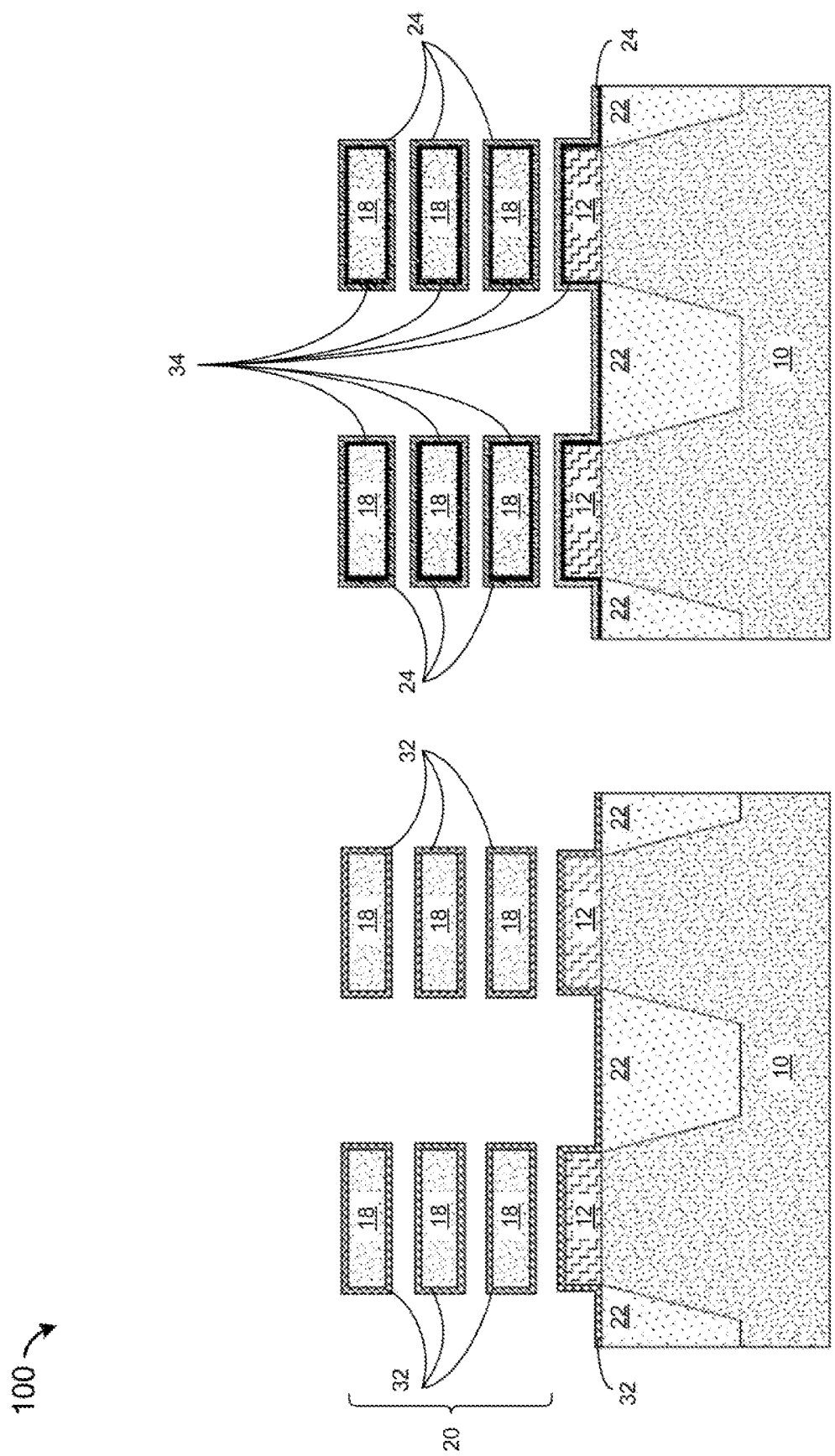
FIG. 12 illustrates a cross-sectional view of the semiconductor structure and illustrates removal of the second blanket sacrificial layer and the second gate conductor, according to an exemplary embodiment.

Referring now to FIG. 12, the structure 100 is shown according to an exemplary embodiment. As shown in FIG. 12, the second blanket sacrificial layer 38 and the second sacrificial gate 36 may be removed from the Structure 100. Additionally, the dipole layer 34 may be removed from the Structure A.

As described above, one or more etching techniques, for example a wet etching technique, can be used to selectively remove the second blanket sacrificial layer 38, the second gate conductor 36 from both the Structure A and the Structure B. In the Structure A the wet etch will remove the dipole layer 34 selective to the crystallized gate dielectric 32. In the Structure B, the wet etch may remove a portion of the gate dielectric 24; however, the diffused dipole material remains within remaining portions of the gate dielectric 24 and along the interface between the gate dielectric 24 and the interfacial layer.

Figure 13:
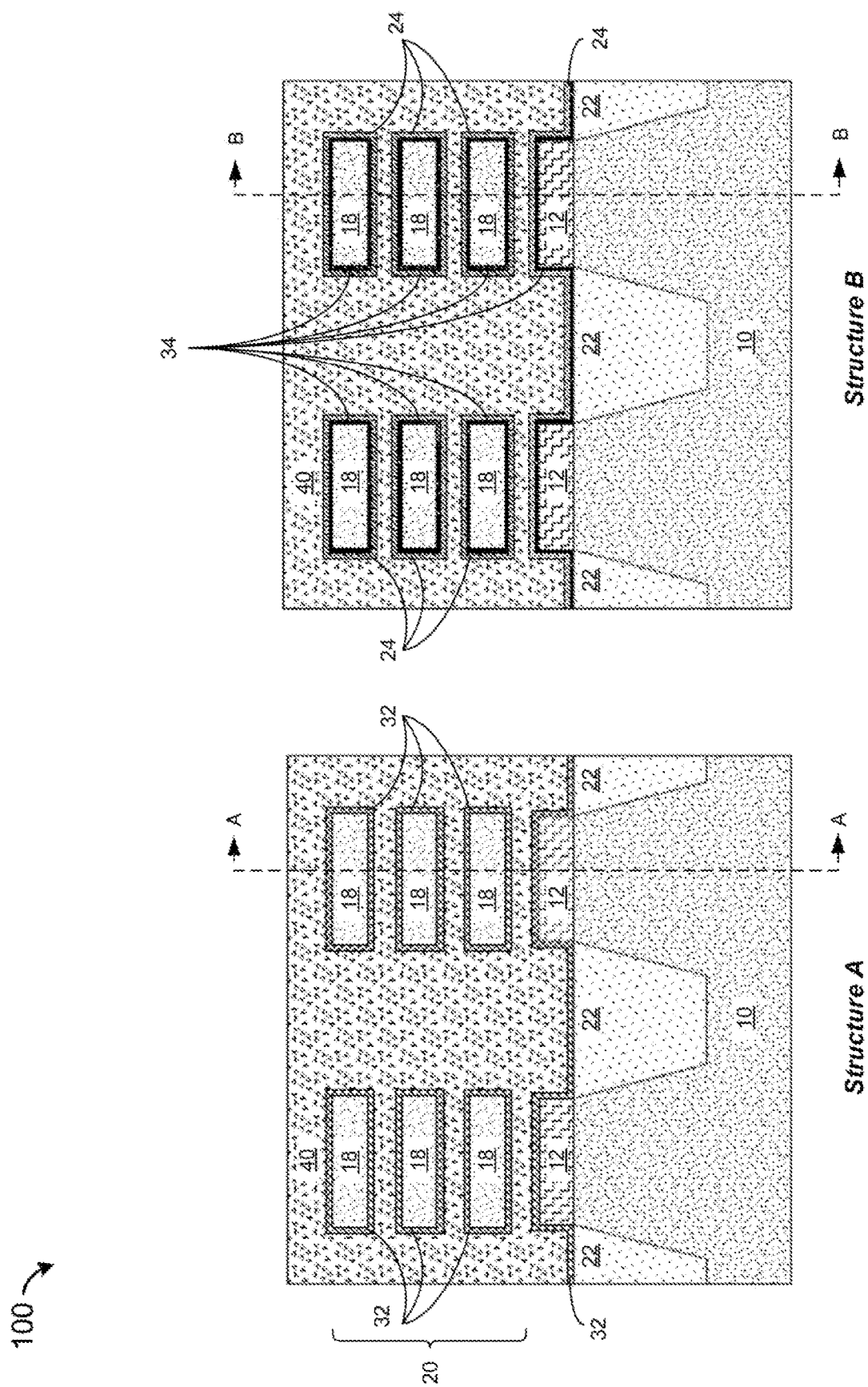
FIG. 13 illustrates a cross-sectional view of the semiconductor structure and illustrates formation of a work function metal, according to an exemplary embodiment.
Figure 14:
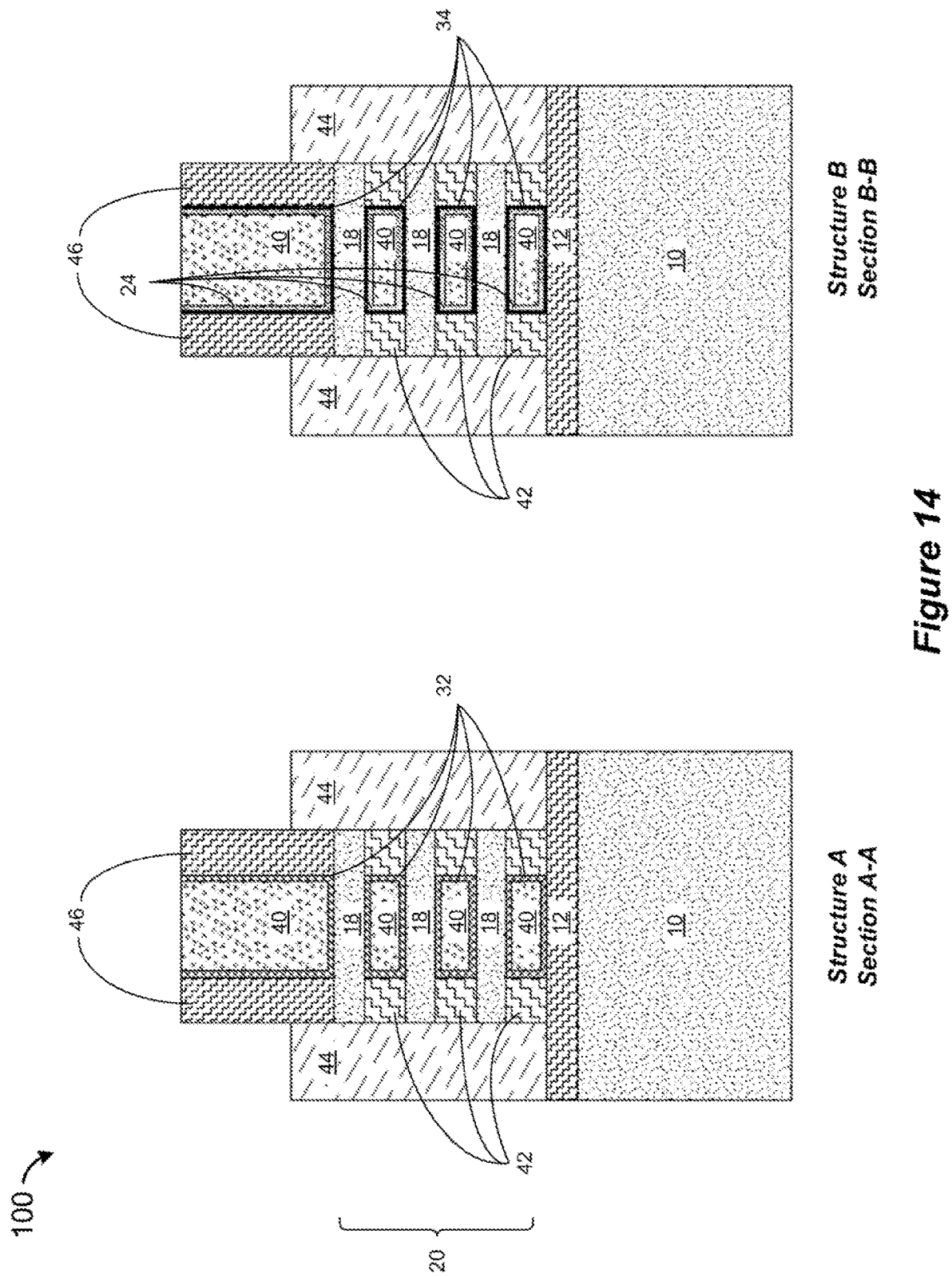
FIG. 14 illustrates a cross-sectional view of the FIG. 13, according to an exemplary embodiment.

Referring now to FIGS. 13 and 14, the structure 100 is shown according to an exemplary embodiment. The Structure A of FIG. 14 is a cross-section view perpendicular to the cross-sectional view of the Structure A illustrated in FIG. 13, along section line A-A. The Structure B of FIG. 14 is a cross-section view perpendicular to the cross-sectional view of the Structure B illustrated in FIG. 13, along section line B-B. As shown in FIGS. 13 and 14, a work function metal 40 may be formed.

The work function metal 40 may be formed as part of a traditional gate process for the nanosheet FET formed from the gate stack 20. Due to the differences in the Structure A and the Structure B, the same work function metal 40 may be used for both. The differences in the two structures, including the crystallized gate dielectric 32 of the Structure A compared to the gate dielectric 24 of the Structure A, and the diffused dipole material of the Structure B, may be used to produce two or more transistors having different threshold voltages, even with the same work function metal 40.

In an embodiment, either of the Structures A, B, may be used as either an NFET device, or as a PFET device.

The work function metal 40 may be conformally formed on the structure 100, according to an exemplary embodiment. The work function metal 40 may be deposited using typical deposition techniques, for example, atomic layer deposition (ALD), molecular layer deposition (MLD), and chemical vapor deposition (CVD).

The material chosen for the work function metal 40 may be selected based on whether an NFET device or a PFET device is desired. In an embodiment, the work function metal 40 of a PFET device may include a metal nitride, for example, titanium nitride or tantalum nitride, titanium carbide titanium aluminum carbide, or other suitable materials known in the art. In an embodiment, the work function metal 40 of an NFET device may include, for example, titanium aluminum carbide or other suitable materials known in the art. In an embodiment, the work function metal 40 may include one or more layers to achieve desired device characteristics.

As shown in FIG. 14, an inner spacer 42 may be formed, a source drain regions 44, and a gate spacer 46 may all be formed according to know techniques. Formation of the source drain regions 44 and the gate spacer 46 is typically completed prior to beginning fabrication illustrated in FIG. 1.

Within the structure 100, there may be different combinations of gate dielectric layers and dipole layers to produce devices with different threshold voltages.

In accordance with the embodiments described herein, selective crystallization of the gate dielectric yields at least four different techniques to control or adjust the threshold voltages of nanosheet devices are disclosed. For example, a first nanosheet transistor having a first threshold voltage would include only the gate dielectric 24 alone without crystallization and without the dipole layer; a second nanosheet transistor having a second threshold voltage would include only the crystallized gate dielectric 32 alone without the dipole layer 34; a third nanosheet transistor having a third threshold voltage would include the dipole layer 34 diffused into the gate dielectric 24, as illustrated in Structure B; and a fourth nanosheet transistor having a fourth threshold voltage would include only the dipole layer 34 on top of the crystalized gate dielectric 32, as illustrated in Structure A.

As briefly mentioned above, embodiments of the present invention disclose more efficient and less invasive techniques to fabricate nanosheet transistors with different threshold voltages. For example, conventional manufacturing techniques require depositing different materials, for example, different gate dielectrics, to achieve different threshold voltages. Doing so inherently requires multiple deposition, masking, and etching techniques which can be invasive and harmful to surrounding structures. Instead, embodiments of the present invention provide techniques to achieve different threshold voltages while minimizing extra process steps, thereby minimizing collateral damage to surrounding structures. For example, embodiments of the present invention begin with a single gate dielectric material

(24) and devices with different threshold voltages can be achieved by modifying the gate dielectric through crystallization.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
    nanosheet stacks on a substrate, each nanosheet stack comprising alternating layers of a sacrificial semiconductor material and a semiconductor channel material vertically aligned and stacked one on top of another; and
    a crystallized gate dielectric layer surrounding the layers of semiconductor channel material of a first subset of the nanosheet stacks, wherein the crystallized gate dielectric layer directly contacts and covers shallow trench isolation regions between adjacent nanosheet stacks;
    a dipole layer on top of the crystallized gate dielectric layer and surrounding the layers of semiconductor channel material of the first subset of the nanosheet stacks; and
    a gate dielectric modified by a diffused dipole material surrounding the layers of semiconductor channel material of a second subset of the nanosheet stacks.

2. The semiconductor structure according to claim 1, further comprising:
    a first gate conductor layer orthogonal to the nanosheet stacks, the first gate conductor layer wraps around the layers of semiconductor channel material of the nanosheet stacks.

3. The semiconductor structure according to claim 1, wherein crystallizing the gate dielectric comprises annealing the gate dielectric to form the crystallized gate dielectric layer.

4. The semiconductor structure according to claim 1, wherein the layers of sacrificial semiconductor material comprise silicon germanium.

5. The semiconductor structure according to claim 1, further comprising:
    source drain regions extending laterally from either end of the layers of semiconductor channel material of the nanosheet stacks.

6. A semiconductor structure comprising:
    nanosheet stacks on a substrate, each nanosheet stack comprising alternating layers of a sacrificial semiconductor material and a semiconductor channel material vertically aligned and stacked one on top of another; and
    a crystallized gate dielectric layer surrounding the layers of semiconductor channel material of the nanosheet stacks, wherein the crystallized gate dielectric layer directly contacts and covers shallow trench isolation regions between adjacent nanosheet stacks.

7. The semiconductor structure according to claim 6, further comprising:
    a dipole layer on top of the crystallized gate dielectric layer and surrounding the layers of semiconductor channel material of a subset of the nanosheet stacks.

8. The semiconductor structure according to claim 6, further comprising:
    a first gate conductor layer orthogonal to the nanosheet stacks, the first gate conductor layer wraps around the layers of semiconductor channel material of the nanosheet stacks.

9. The semiconductor structure according to claim 6, wherein
    crystallizing the gate dielectric comprises annealing the gate dielectric to form the crystallized gate dielectric layer.

10. The semiconductor structure according to claim 6, wherein the layers of sacrificial semiconductor material comprise silicon germanium.

11. The semiconductor structure according to claim 6, further comprising:
    source drain regions extending laterally from either end of the layers of semiconductor channel material of the nanosheet stacks.

12. A method comprising:
    forming nanosheet stacks on a substrate, each nanosheet stack comprising alternating layers of a sacrificial semiconductor material and a semiconductor channel material vertically aligned and stacked one on top of another;
    removing the layers of sacrificial semiconductor material of the set of nanosheet stacks;
    forming a gate dielectric surrounding the layers of semiconductor channel material of the nanosheet stacks; and
    crystalizing the gate dielectric of a first subset of the nanosheet stacks, wherein the crystallized gate dielectric layer directly contacts and covers shallow trench isolation regions between adjacent nanosheet stacks.

13. The method according to claim 12, further comprising:
    forming a dipole layer surrounding the gate dielectric which surrounds the layers of semiconductor channel material of a second subset of the nanosheet stacks.

14. The method according to claim 13, further comprising:
    diffusing the dipole layer into the gate dielectric surrounding the layers of semiconductor channel material of the second subset of the nanosheet stacks.

15. The method according to claim 12, further comprising:
    forming a first gate conductor layer orthogonal to the nanosheet stacks, the first gate conductor wraps around the layers of semiconductor channel material of the nanosheet stacks.

16. The method according to claim 12, wherein crystallizing the gate dielectric comprises annealing the gate dielectric to form the crystallized gate dielectric layer.

17. The method according to claim 12, wherein the layer of sacrificial semiconductor material comprise silicon germanium.

18. The method according to claim 12, further comprising:
    forming source drain regions extending laterally from either end of the semiconductor channel material layers of the nanosheet stacks.

* * * * *